United States Patent
Nunokawa (10) Patent No.: US 7,915,911 B2
(45) Date of Patent: Mar. 29, 2011

(54) INPUT CIRCUIT AND SEMICONDUCTOR INTEGRATED CIRCUIT

(75) Inventor: Hideo Nunokawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/724,942

(22) Filed: Mar. 16, 2010

(65) Prior Publication Data

US 2010/0237905 A1 Sep. 23, 2010

(30) Foreign Application Priority Data

Mar. 19, 2009 (JP) ................. 2009-068605

(51) Int. Cl.
*H03K 19/0175* (2006.01)
*H03K 5/08* (2006.01)
*H02H 3/20* (2006.01)

(52) U.S. Cl. ................ 326/26; 326/27; 326/88; 326/86; 326/83; 361/56; 361/111; 327/310; 327/318

(58) Field of Classification Search .............. 326/26–27, 326/83, 86, 88, 104; 327/310, 318; 361/56, 361/111
See application file for complete search history.

(56) References Cited

U.S. PATENT DOCUMENTS

| 6,144,217 | A | 11/2000 | Iwata et al. | |
|---|---|---|---|---|
| 6,288,582 | B1 * | 9/2001 | Shigehara | 327/112 |
| 6,313,664 | B1 * | 11/2001 | Hall et al. | 326/83 |
| 6,747,501 | B2 * | 6/2004 | Ker et al. | 327/310 |
| 7,187,530 | B2 * | 3/2007 | Salling et al. | 361/111 |
| 7,304,827 | B2 * | 12/2007 | Chen et al. | 361/56 |
| 7,440,248 | B2 * | 10/2008 | Arai et al. | 361/56 |
| 7,786,761 | B2 * | 8/2010 | Lin | 326/82 |

FOREIGN PATENT DOCUMENTS

| JP | 2000-36561 | 2/2000 |
|---|---|---|
| JP | 2000-101409 | 4/2000 |

* cited by examiner

*Primary Examiner* — Vibol Tan (74) *Attorney, Agent, or Firm* — Staas & Halsey LLP (57) ABSTRACT

An input circuit for receiving an input signal supplied to an input terminal includes a capacitor having one end connected to the input terminal and a capacitor driving circuit for converting the input signal into a signal having positive logic that is the same as logic of the input signal and supplying the converted signal to the other end of the capacitor so as to drive the capacitor.

18 Claims, 12 Drawing Sheets

| | Average terminal voltage value in input circuit in the related art | Average terminal voltage value in input circuit according to first embodiment |
|---|---|---|
| At the time of pull-up (ideal terminal voltage is 5 V) | 3.53 V | 4.56 V |
| At the time of pull-down (ideal terminal voltage is 0 V) | 1.53 V | 0.07 V |

INPUT CIRCUIT AND SEMICONDUCTOR INTEGRATED CIRCUIT

CROSS REFERENCES TO RELATED APPLICATIONS

This application is based upon and claims the benefit of priority from the prior Japanese Patent Application No. 2009-68605 filed on Mar. 19, 2009, the entire contents of which are incorporated herein by reference.

FIELD

Various embodiments described herein relate to an input circuit and a semiconductor integrated circuit.

BACKGROUND

Semiconductor integrated circuits are widely used at various locations. For example, various electronic apparatuses, such as an engine control apparatus, a brake control apparatus, a car navigation apparatus, and an audio apparatus are installed in vehicles.

Users of vehicles may dispose a personal radio apparatus, an amateur radio apparatus, or the like in the vehicles and use it. In this case, various electronic apparatuses in a dashboard may receive a radio wave (an electromagnetic wave) at close range.

Thus, if various electronic apparatuses installed in vehicles receive a strong electromagnetic wave at close range, they may malfunction under the influence of such a strong electromagnetic wave.

As the most effective way to avoid being influenced by an electromagnetic wave, shielding is generally performed. There are various types of shielding methods, including a method of covering the whole of an electronic apparatus and a method of partially covering the printed circuit board (PCB) of an electronic apparatus. A shielding method is determined in accordance with the balance between sensitivity to an electromagnetic wave of an electronic apparatus and a shielding cost.

An input circuit in the related art and the problem of the input circuit will be described with reference to FIGS. 1 to 3.

Figure 1:
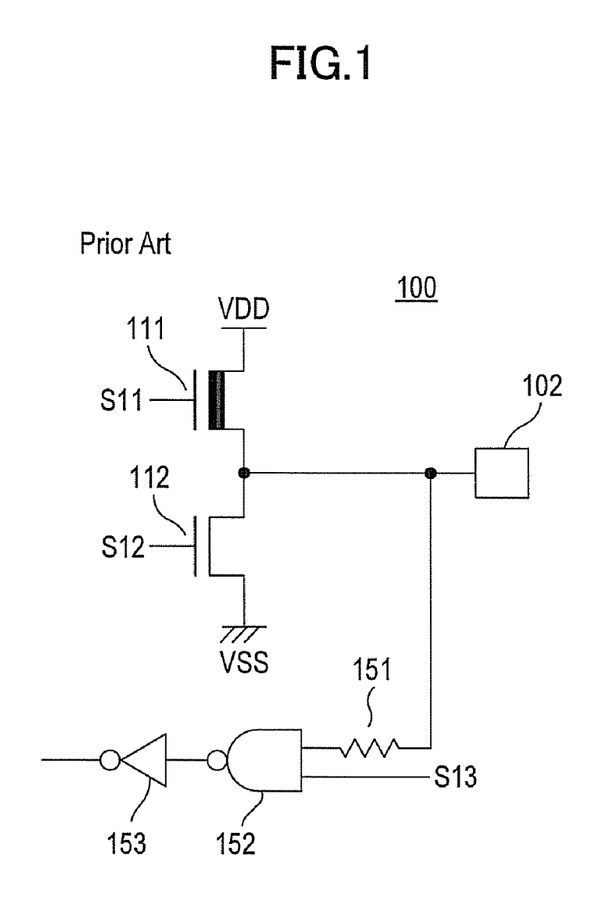
FIG. 1 is a circuit diagram illustrating an example of an input circuit in the related art.

FIG. 1 is a circuit diagram illustrating an example of an input/output circuit (input circuit) in the related art that can be used as an input/output terminal (input terminal) in a semiconductor integrated circuit (LSI).

In this specification, for simplification of explanation, not only an original input terminal but also a terminal that can be used as both an input terminal and an output terminal are described as input terminals. Furthermore, not only an original input circuit but also a circuit functioning as both an input circuit and an output circuit are described as input circuits.

As illustrated in FIG. 1, an input circuit 100 in the related art includes a p-channel MOS (pMOS) transistor 111, an n-channel MOS (nMOS) transistor 112, a resistor 151, a NAND gate 152, and an inverter 153.

The pMOS transistor 111 and the nMOS transistor 112 are connected in series between a high-potential power supply line VDD and a low-potential power supply line (ground line) VSS. Output control signals S11 and S12 are supplied to the gates of the transistors 111 and 112, respectively.

An input terminal 102 is connected to a connection node between the transistors 111 and 112, and is also connected to one of input terminals of the NAND gate 152 via the resistor 151. An input block control signal S13 is supplied to the other one of the input terminals of the NAND gate 152. A signal output from the NAND gate 152 is input into an LSI via the inverter 153.

In the input circuit 100 illustrated in FIG. 1, if the input terminal 102 is used as an original input terminal, both the transistors 111 and 112 are brought into an OFF state by setting the output control signal S11 to a high level "H" and the output control signal S12 to a low level "L".

Subsequently, by setting the input block control signal S13 to "H", a signal supplied to the input terminal 102 is input into the LSI, that is, is supplied to a predetermined internal circuit of the LSI, via the resistor 151, the NAND gate 152, and the inverter 153.

On the other hand, if the input terminal 102 is used as an output terminal, only one of the transistors 112 and 111 is brought into an ON state by setting both the output control signals S11 and S12 to "H" or "L". As a result, an "L" or "H" signal is output to the input terminal 102.

That is, a signal having logic opposite to that of the output control signals S11 and S12 is output from the input terminal (output terminal) 102.

At that time, the input block control signal S13 supplied to the other one of the input terminals of the NAND gate 152 is set to "L" and a signal transmitted from the input terminal 102 is blocked by the NAND gate 152 so as not to be input into the LSI.

Figure 2:
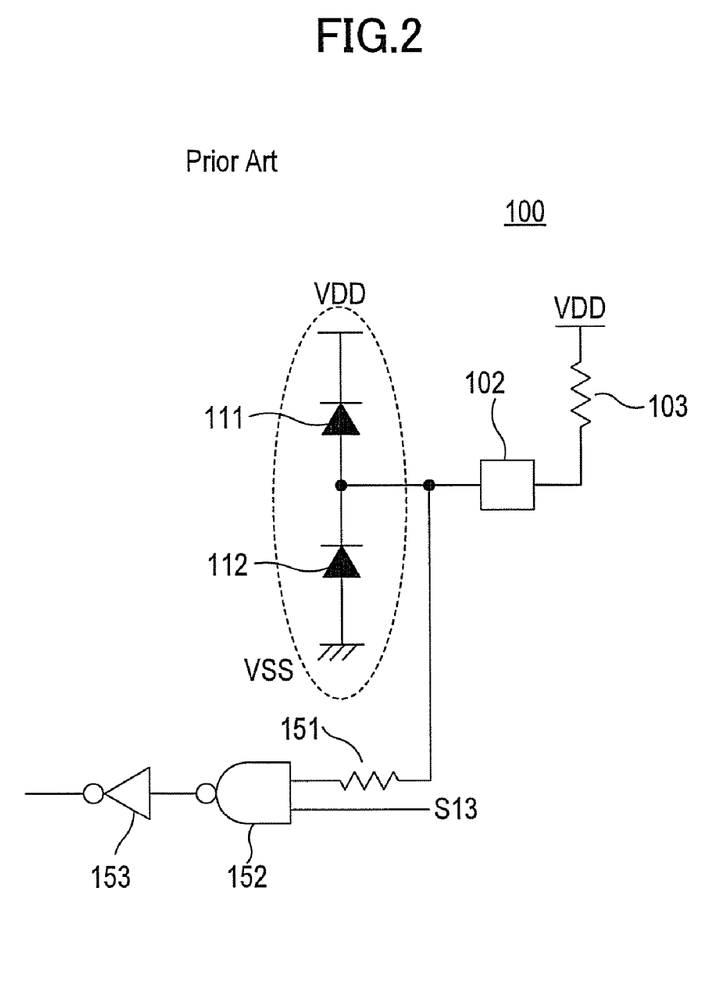
FIG. 2 is a diagram describing an exemplary operation of the input circuit illustrated in FIG. 1.

FIG. 2 is a diagram describing an exemplary operation of the input circuit illustrated in FIG. 1 when the input terminal 102 included in the input circuit 100 uses a pull-up resistor 103.

As illustrated in FIG. 2, if both the transistors 111 and 112 are brought into the OFF state by setting the output control signal S11 to "H" and the output control signal S12 to "L", diodes parasitic to the transistors 111 and 112 function as if they were connected to each other.

A direction in which the diode parasitic to the transistor 111 is connected to a power supply voltage is opposite to a direction in which the diode parasitic to the transistor 112 is connected to a power supply voltage. For example, these parasitic diodes function so as to prevent the input terminal 102 from destroying a circuit with static noise (electrostatic discharging (ESD)).

Figure 3:
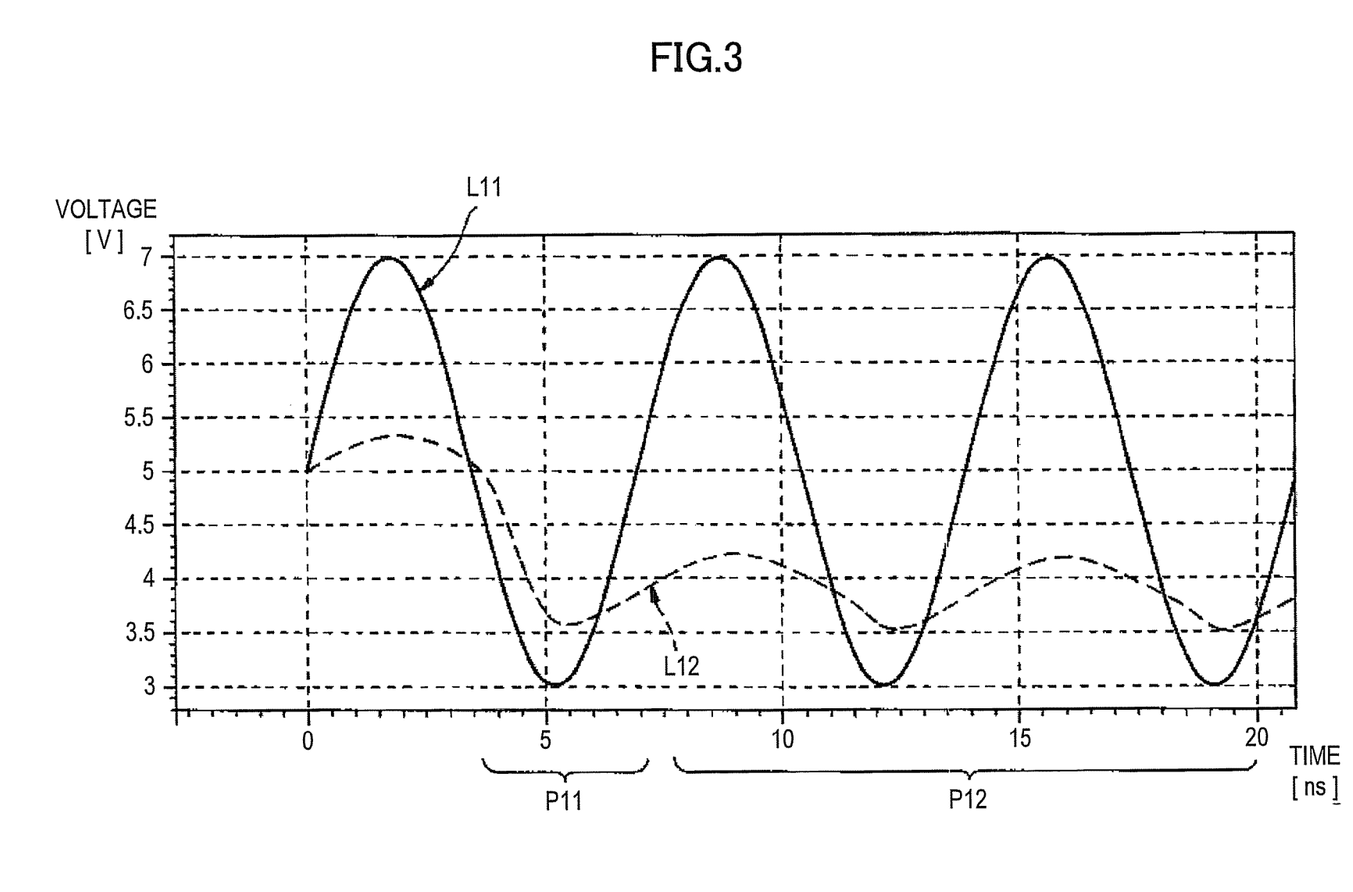
FIG. 3 is a simulation waveform diagram illustrating an exemplary terminal voltage in the input circuit illustrated in FIG. 2.

FIG. 3 is a simulation waveform diagram illustrating an example of a terminal voltage in the input circuit illustrated in FIG. 2. Referring to FIG. 3, a curve L11 represents a voltage waveform of a high-potential power supply line VDD (a waveform obtained when the potential of the high-potential power supply line VDD is changed at 144 MHz in the range of 5 V±2 Vp-p), and a curve L12 represents the waveform of the input terminal 102.

For example, if the potential of the high-potential power supply line VDD for supplying 5 V is changed at 144 MHz by ±2 V as indicated by the curve L11 illustrated in FIG. 3, the waveform of the input terminal 102 becomes the curve L12 illustrated in FIG. 3 by the diodes parasitic to the transistors 111 and 112 illustrated in FIG. 2.

For example, high-frequency noise is strongly applied to the high-potential power supply line VDD because of a radio wave (electromagnetic wave) of 144 MHz, a forward current passes through the parasitic diode on the side of the high-potential power supply line VDD and the level "H" of the input terminal 102 is instantaneously reduced when the potential of the high-potential power supply line VDD decreases (see, a period P11 illustrated in FIG. 3).

Since a forward current does not pass through the parasitic diode when the potential of the high-potential power supply line VDD increases, the input terminal 102 receives a current only from the pull-up resistor 103. As a result, the next decrease in the potential of the high-potential power supply line VDD occurs before the potential of the input terminal 102 decreases to the same potential as that of the high-potential power supply line VDD and the level of the input terminal 102 is reduced by a forward current passing through the parasitic diode.

If the above-described operation is repeated, the level "H" of the input terminal 102 is reduced, as indicated by the curve L12 illustrated in FIG. 3 (see, a period P12 illustrated in FIG. 3).

If such a phenomenon becomes pronounced, a signal of the level "L" may be erroneously input into the LSI via the NAND gate 152 and the inverter 153 despite the fact that the input terminal (input signal) 102 is not brought into the level "L" and a malfunction may occur.

FIGS. 2 and 3 illustrate a case in which the input terminal 102 is connected to the pull-up resistor 103. However, in a case where the input terminal 102 is connected to a pull-down resistor, a similar problem occurs.

That is, if a pull-down resistor is used, the level "L" of the input terminal 102 is increased by a mechanism similar to that described in the above-described case (by a forward current that passes through the parasitic diode on the side of the low-potential ground line VSS in response to the change in the potential of the low-potential ground line VSS). As a result, the level "L" of the input terminal 102 may be misidentified as the level "H" of the input terminal 102 and a malfunction may occur.

Japanese Laid-open Patent Publication Nos. 2000-101409 and 2000-036561 disclose semiconductor integrated circuits including input circuits used for noise reduction.

SUMMARY

According to an aspect of the embodiment, an input circuit for receiving an input signal supplied to an input terminal includes a capacitor having one end connected to the input terminal; and a capacitor driving circuit for converting the input signal into a signal having positive logic that is the same as logic of the input signal and supplying the converted signal to the other end of the capacitor so as to drive the capacitor.

It is to be understood that both the foregoing general description and the following detailed description are exemplary and explanatory and are not restrictive of the invention, as claimed.

The above-described embodiments of the present invention are intended as examples, and all embodiments of the present invention are not limited to including the features described above.

DESCRIPTION OF THE PREFERRED EMBODIMENTS

Figure 4:
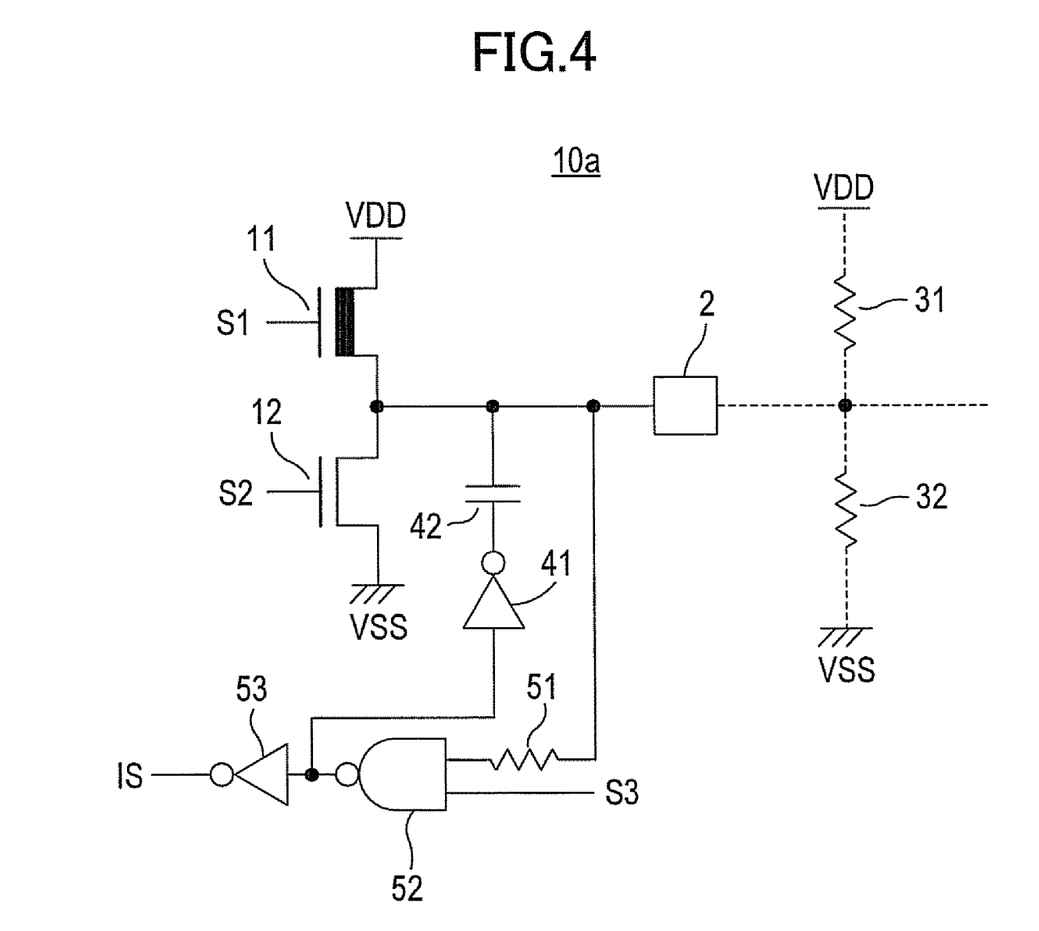
FIG. 4 is a circuit diagram illustrating an example of an input circuit according to a first embodiment.

An input circuit according to an embodiment and a semiconductor integrated circuit according to an embodiment will be described in detail below with reference to the accompanying drawings. FIG. 4 is a circuit diagram illustrating an example of an input circuit (input/output circuit) according to a first embodiment that can be used as an input terminal (input/output terminal) in a semiconductor integrated circuit (LSI).

As illustrated in FIG. 4, an input circuit 10a according to the first embodiment includes a pMOS transistor 11, an nMOS transistor 12, a resistor 51, a NAND gate 52, and an inverter 53.

The pMOS transistor 11 and the nMOS transistor 12 are connected in series between the high-potential power supply line VDD and the low-potential power supply line VSS. Output control signals S1 and S2 are supplied to the gates of the transistors 11 and 12, respectively.

An input terminal 2 is connected to the connection node between the transistors 11 and 12 and is also connected to one of input terminals of the NAND gate 52 via the resistor 51. An input block control signal S3 is supplied to the other one of the input terminals of the NAND gate 52. A signal output from the NAND gate 52 is input into an LSI via the inverter 53 as a signal IS.

An output terminal of the NAND gate 52 is connected to an input terminal of an inverter 41. An output terminal of the inverter 41 is connected to the other end of a capacitor 42. One end of the capacitor 42 is connected to the input terminal 2.

In the input circuit 10a illustrated in FIG. 4, if the input terminal 2 is used as an original input terminal, both the transistors 11 and 12 are brought into an OFF state by setting the output control signal S1 to a high level "H" and the output control signal S2 to a low level "L".

Subsequently, by setting the input block control signal S3 to "H", a signal supplied to the input terminal 2 is input into the LSI, that is, is supplied to a predetermined internal circuit of the LSI, via the resistor 51, the NAND gate 52, and the inverter 53.

At that time, the other end of the capacitor 42 having one end connected to the input terminal 2 is driven by a signal obtained by causing the NAND gate 52 and the inverter 41 to invert a signal transmitted from the input terminal 2 two times in total (to non-invert the signal).

If the input terminal 2 is used as an original input terminal, a pull-up resistor 31 or a pull-down resistor 32 is connected to the input terminal 2.

That is, if the pull-up resistor 31 is connected to the input terminal 2, the potential of the input terminal 2 becomes the potential (for example, 5 V) of the high-potential power supply line VDD when no input signal is externally supplied to the input terminal 2 and is changed between the potential of the high-potential power supply line VDD and a low potential (for example, 0 V) caused by an externally input signal.

On the other hand, if the pull-down resistor 32 is connected to the input terminal 2, the potential of the input terminal 2 becomes the potential (for example, 0 V) of the low-potential power supply line VSS when no input signal is externally supplied to the input terminal 2 and is changed between the potential of the low-potential power supply line VSS and a high potential (for example, 5 V) caused by an externally input signal.

A user of the semiconductor integrated circuit including the input circuit 10a may externally attach the pull-up resistor 31 or the pull-down resistor 32 to the semiconductor integrated circuit or may dispose the pull-up resistor 31 or the pull-down resistor 32 in the semiconductor integrated circuit in advance.

If the level of the input terminal 2 is "H" when the pull-up resistor 31 is connected to the input terminal 2, the capacitor 42 enables the level of the input terminal 2 to follow the change in the potential of the high-potential power supply line VDD even if, for example, the potential of the high-potential power supply line VDD is changed under the influence of an electromagnetic wave.

If the level of the input terminal 2 is "L" when the pull-down resistor 32 is connected to the input terminal 2, the capacitor 42 enables the level of the input terminal 2 to follow the change in the potential of the low-potential power supply line VSS even if, for example, the potential of the low-potential power supply line VSS is changed under the influence of an electromagnetic wave. A simulation result obtained in a case where the pull-up resistor 31 is connected to the input terminal 2 and a simulation result obtained in a case where the pull-down resistor 32 is connected to the input terminal 2 will be described later with reference to FIGS. 9 and 10, respectively.

Thus, in the input circuit 10a according to the first embodiment, since the level of a signal at the input terminal 2 follows the change in a power supply voltage which is caused, for example, under the influence of a strong electromagnetic wave, it is possible to prevent an error logic determination even if a power supply voltage is changed and suppress the occurrence of a malfunction.

If the input terminal 2 is used as an output terminal, only one of the transistors 11 and 12 is brought into the ON state by setting both the output control signals S1 and S2 to "H" or "L". As a result, an "L" or "H" signal is output to the input terminal (output terminal) 2.

That is, a signal having logic opposite to that of the output control signals S1 and 82 is output from the input terminal 2.

At that time, the input block control signal S3 supplied to the other one of the input terminals of the NAND gate 52 is set to "L" and a signal transmitted from the input terminal 2 is blocked by the NAND gate 52 so as not to be input into the LSI.

Figure 5:
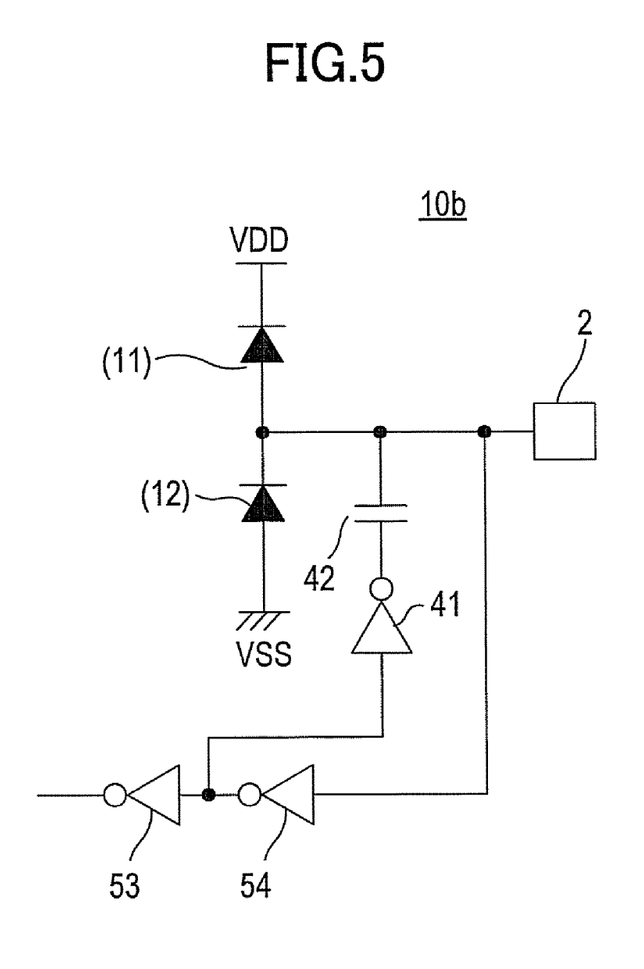
FIG. 5 is a circuit diagram illustrating an example of an input circuit according to a second embodiment.

FIG. 5 is a circuit diagram illustrating an example of an input circuit according to a second embodiment that does not have an output circuit function.

As illustrated in FIG. 5, in an input circuit 10b according to the second embodiment, the input terminal 2 is connected to an input terminal of an inverter 54 and an output terminal of the inverter 54 is connected to input terminals of the inverters 53 and 41.

An output terminal of the inverter 41 is connected to the other end of the capacitor 42. One end of the capacitor 42 is connected to the input terminal 2. That is, the input circuit 10b according to the second embodiment illustrated in FIG. 5 differs from the input circuit 10a according to the first embodiment illustrated in FIG. 4 in that the inverter 54 is used instead of the NAND gate 52 and the resistor 51. The resistor 51 may be included in the input circuit 10b.

Like in the input circuit 10a according to the first embodiment, in the input circuit 10b according to the second embodiment, diodes parasitic to the pMOS transistor 11 and the nMOS transistor 12 may be used. Alternatively, dedicated diodes may be disposed.

Like in the input circuit 10a according to the first embodiment, in the input circuit 10b according to the second embodiment, the capacitor 42 performs a similar operation when a pull-up resistor or a pull-down resistor is connected to the input terminal 2. Accordingly, it is possible to suppress the occurrence of a malfunction which is caused under the influence of an electromagnetic wave.

That is, in the input circuit 10b according to the second embodiment, since the level of a signal at the input terminal 2 follows the change in a power supply voltage which is caused, for example, under the influence of a strong electromagnetic wave, it is possible to prevent an error logic determination even if a power supply voltage is changed and suppress the occurrence of a malfunction.

Figure 6:
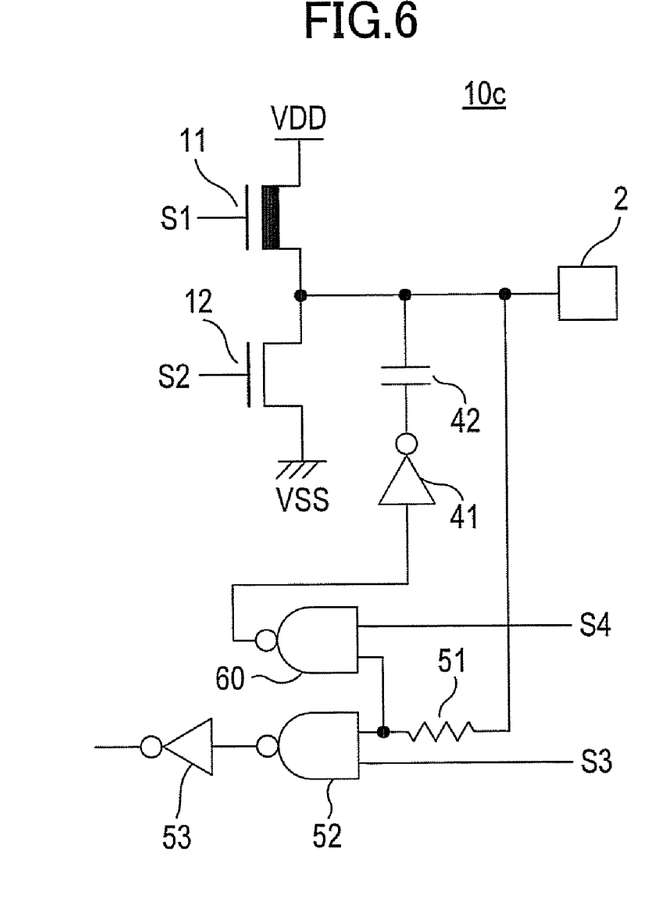
FIG. 6 is a circuit diagram illustrating an example of an input circuit according to a third embodiment.

FIG. 6 is a circuit diagram illustrating an example of an input circuit according to a third embodiment. As is apparent from the comparison between FIGS. 6 and 4, in an input circuit 10c according to a third embodiment, a NAND gate 60 is added to the components included in the input circuit 10a according to the first embodiment.

That is, an input block control signal S4 is supplied to one of input terminals of the NAND gate 60, the other one of the input terminals of the NAND gate 60 is connected to one of the input terminals of the NAND gate 52, and an output terminal of the NAND gate 60 is connected to the input terminal of the inverter 41.

In the input circuit 10a according to the first embodiment, a signal output from the NAND gate 52 for receiving an input signal is inverted by the inverter 41 so as to drive the capacitor 42.

On the other hand, in the input circuit 10c according to the third embodiment, a signal output from the NAND gate 60 different from the NAND gate 52 for receiving an input signal is inverted by the inverter 41 so as to drive the capacitor 42.

The input block control signal S4 is the same as the input block control signal S3. If the input terminal 2 is used as an output terminal, the input block control signal S4 is set to "L" so as to block a signal transmitted from the input terminal (output terminal) 2 at the NAND gates 52 and 60.

For example, the third embodiment is useful for a case in which a threshold value for the NAND gate 52 for receiving an input signal is made different from that for the NAND gate 60 used to drive the capacitor 42 or a case in which the delay in the reception of an input signal caused by the increase in the capacity of a circuit for receiving an input signal is reduced.

More specifically, for example, in order to suppress the occurrence of noise, the capacitor 42 is rapidly driven by setting the channel width (gate width) of a MOS transistor forming the NAND gate 60 along with the inverter 41 so that it is approximately ten times of the channel width of a MOS transistor forming the NAND gate 52.

In the above-described embodiments, a component for driving the capacitor 42 is not limited to the inverter 41. A NAND gate or NOR gate capable of driving a signal transmitted from the input terminal 2 in positive logic may be used.

In the above-described embodiments, a signal having positive logic obtained by inverting a signal transmitted from the input terminal 2 two times is supplied to the other end of the capacitor 42 having one end connected to the input terminal 2.

However, any signal having positive logic obtained by inverting a signal transmitted from the input terminal 2 four or six times may be supplied to the other end of the capacitor 42. Furthermore, instead of an even number of inverting circuits, a buffer circuit may be used.

Figure 7:
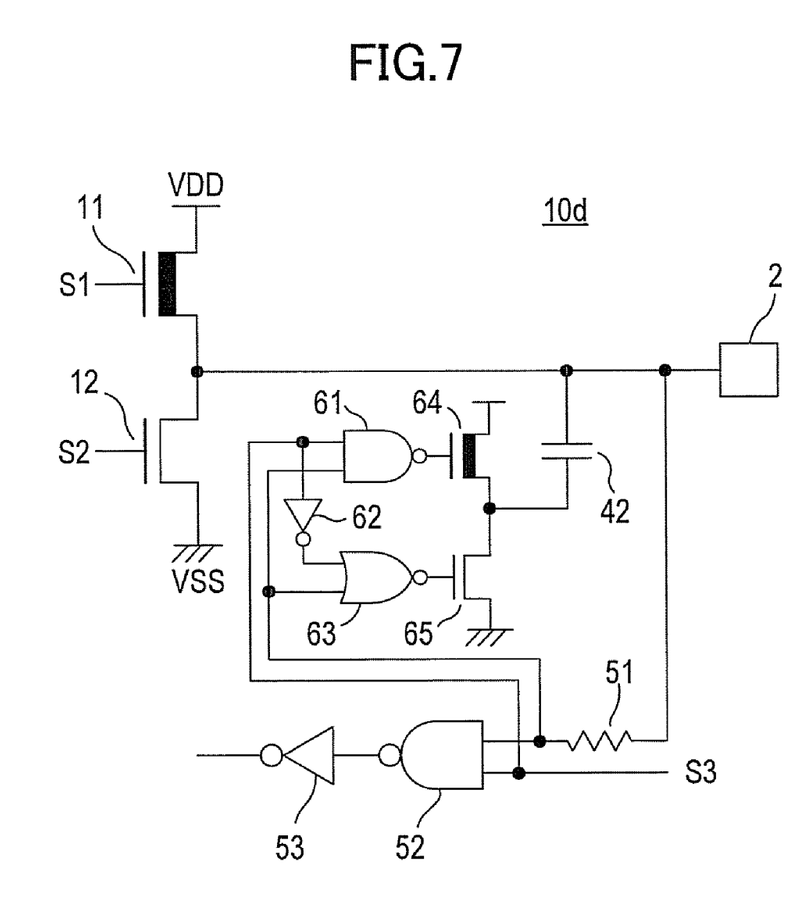
FIG. 7 is a circuit diagram illustrating an example of an input circuit according to a fourth embodiment.

FIG. 7 is a circuit diagram illustrating an example of an input circuit according to a fourth embodiment that is used to reduce the effect of the capacitor 42 when the input terminal 2 is used as an output terminal.

As illustrated in FIG. 7, in an input circuit 10d according to the fourth embodiment, instead of the inverter 41 included in the input circuit 10a according to the first embodiment illustrated in FIG. 4, a NAND gate 61, an inverter 62, a NOR gate 63, a pMOS transistor 64, and an nMOS transistor 65 are disposed.

One end of the NAND gate 61 is connected to the input terminal 2 via the resistor 51. The input block control signal S3 is supplied to the other end of the NAND gate 61. One end of the NOR gate 63 is connected to the input terminal 2 via the resistor 51. The input block control signal S3 is inverted by the inverter 62 and is then supplied to the other end of the NOR gate 63.

A signal output from the NAND gate 61 is supplied to the gate of the pMOS transistor 64. A signal output from the NOR gate 63 is supplied to the gate of the nMOS transistor 65.

In the first embodiment, for example, when the input terminal 2 is used as an output terminal by setting the level of the input block control signal S3 to "L", the other end of the capacitor 42 having one end connected to the input terminal (output terminal) 2 has the level of "L". This reduces a signal change speed at the input terminal 2.

The reduction in a signal change speed does not cause a problem when a circuit operation is performed at a low speed. However, if a clock speed is increased and a circuit operation speed is therefore increased, the reduction in a signal change speed becomes a noticeable problem.

In the input circuit 10d according to the fourth embodiment, since the level of the input block control signal S3 is "L" when the input terminal 2 is used as an output terminal, the level of a signal output from the NAND gate 61 becomes "H" and the level of a signal output from the NOR gate 63 becomes "L".

As a result, both the pMOS transistor 64 and the nMOS transistor 65 are brought into the OFF state, and the other end of the capacitor 42 having one end connected to the input terminal (output terminal) 2 is brought into a high-impedance state.

Consequently, it is possible to prevent the reduction in a signal change speed at the input terminal 2 which is caused by the capacitor 42.

Figure 8:
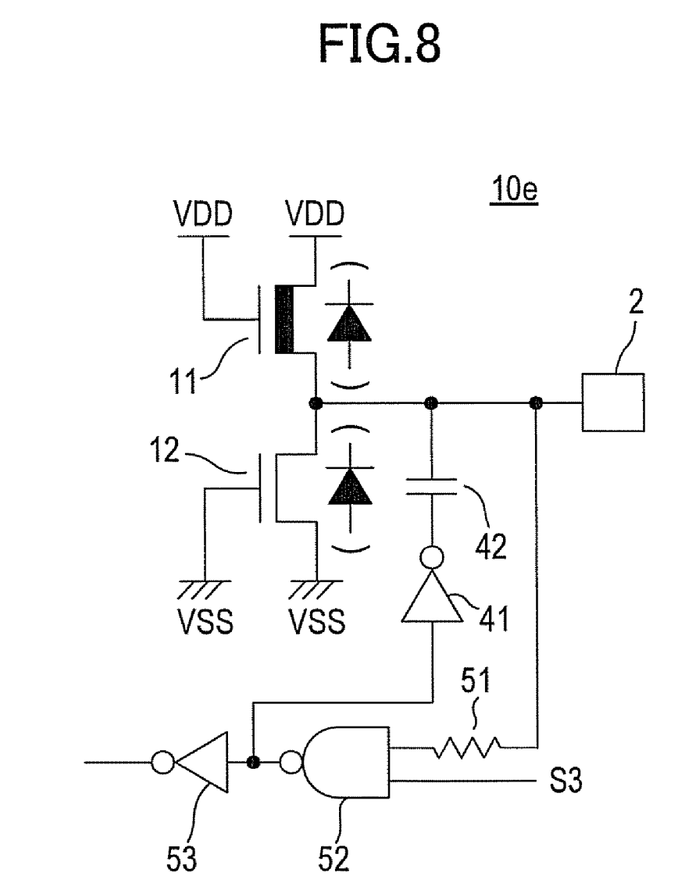
FIG. 8 is a circuit diagram illustrating an example of an input circuit according to a fifth embodiment.

FIG. 8 is a circuit diagram illustrating an example of an input circuit according to a fifth embodiment. Like an input circuit according to the second embodiment, an input circuit according to the fifth embodiment does not have an output circuit function.

As illustrated in FIG. 8, in an input circuit 10e according to the fifth embodiment, the gate of the pMOS transistor 11 is pulled up to the potential of the high-potential power supply line VDD and the gate of the nMOS transistor 12 is pulled down to the potential of the low-potential power supply line VSS.

As a result, both the transistors 11 and 12 are brought into the OFF state, and only the diodes parasitic to the transistors operate.

The reason why the NAND gate 52 receiving the input block control signal S3 is disposed is that the occurrence of a phenomenon is prevented in which the floating of the input terminal 2 occurs when the input terminal 2 is not used and a flow-through current passes through the input circuit 10e when an intermediate-level signal is input into the input circuit 10e.

Accordingly, in order to obtain only an effect of suppressing the occurrence of a malfunction which is caused under the influence of an electromagnetic wave in the fifth embodiment, for example, the NAND gate 52 (and the resistor 51) may be replaced with an inverter.

In order to supply a signal having positive logic to the other end of the capacitor 42, a signal transmitted from the input terminal 2 is inverted two times in total by the NAND gate 52 and the inverter 41. However, as described previously, two gates for inverting the logic of a signal and outputting a signal having the inverted logic may not necessarily be used.

For example, if the capacitance value of the capacitor 42 included in each of input circuits according to the above-described embodiments is too small, an improvement effect is reduced. Accordingly, it is desirable that the capacitance value of the capacitor 42 be approximately the same as that of a capacitor parasitic to the input terminal 2, or, if possible, be two or more times larger than that of a capacitor parasitic to the input terminal 2.

More specifically, for example, when the value of a capacitor parasitic to the input terminal 2 is 5 pF, it is desirable that the value of the capacitor 42 be approximately 10 pF or be larger than 10 pF.

If the value of the capacitor 42 is set to a large value, it is possible to effectively suppress the occurrence of a malfunction caused under the influence of an electromagnetic wave. However, if the value of the capacitor 42 is set to a large value, current consumption and the chip area of an LSI are increased. Accordingly, it is necessary to set the value of the capacitor 42 to an appropriate value in consideration of the estimated frequency and intensity of an electromagnetic wave.

Figure 9:
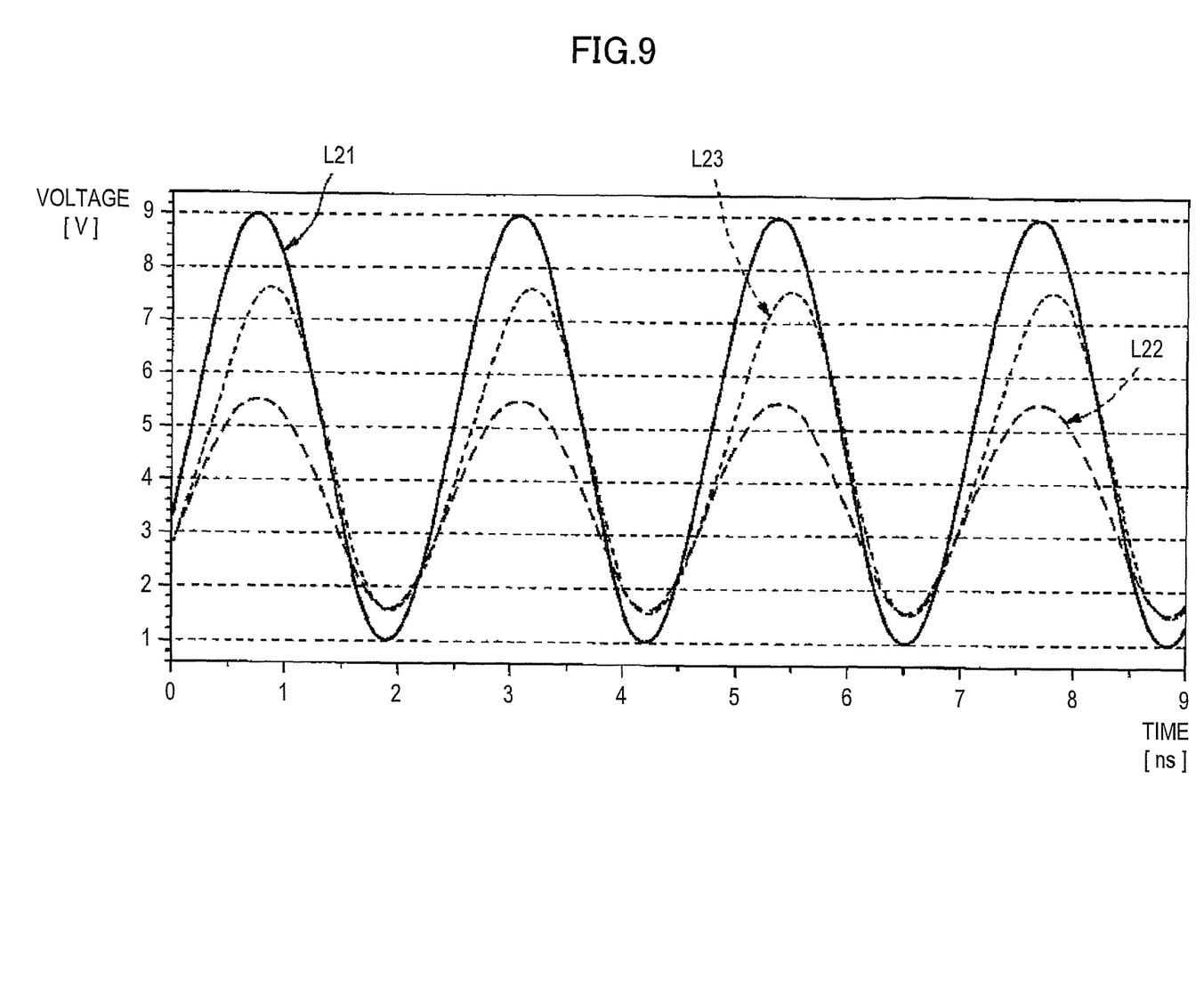
FIG. 9 is a simulation waveform diagram illustrating exemplary terminal voltages in input circuits.
Figure 10:
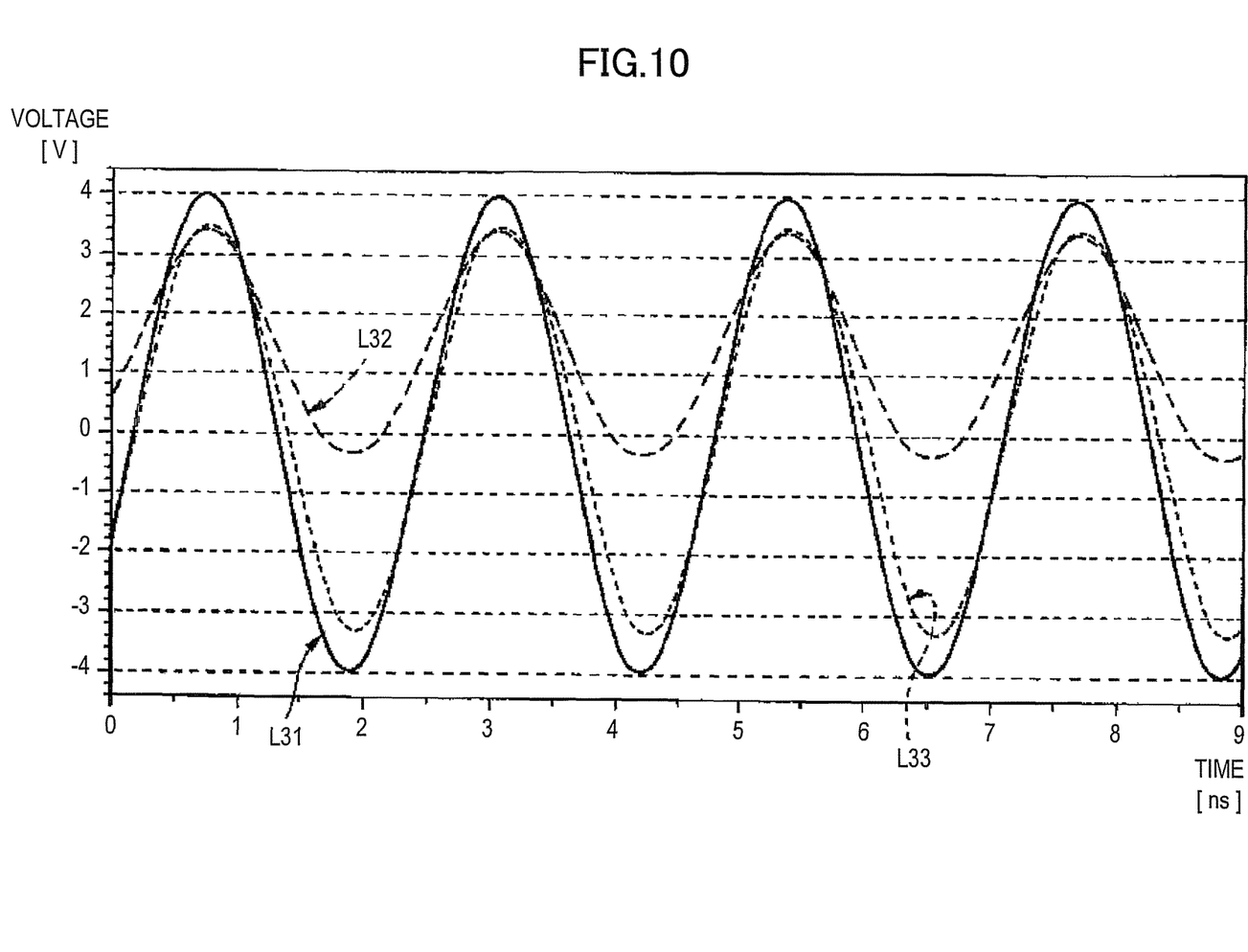
FIG. 10 is a simulation waveform diagram illustrating other exemplary terminal voltages in input circuits.

FIG. 9 is a simulation waveform diagram illustrating exemplary terminal voltages in input circuits. FIG. 10 is a simulation waveform diagram illustrating other exemplary terminal voltages in input circuits.

Circuits used for simulation illustrated in FIGS. 9 and 10 are the input circuit 100 in the related art illustrated in FIG. 1 and the input circuit 10a according to the first embodiment illustrated in FIG. 4. Under the assumption that a general-purpose terminal is used, a circuit constant is set so that the parasitic capacitance values of the input terminals 102 and 2 become 5 pF.

The value of the capacitor 42 included in the input circuit 10a is set to 10 pF. The potential of the high-potential power supply line VDD is applied to the gates of the pMOS transistors 111 and 11. The potential of the low-potential power supply line VSS is applied to the gates of the nMOS transistors 112 and 12. The level of the input block control signals S13 and S3 is set to the potential of the high-potential power supply line VDD.

FIG. 9 illustrates a result of simulation performed when the value of the pull-up resistor 31 (103) is set to 101 kΩ and the potential of the high-potential power supply line VDD is changed from 5 V by a radio wave (an electromagnetic wave) of 433 MHz.

FIG. 10 illustrates a result of simulation performed when the value of the pull-down resistor 32 is set to 10 kΩ and the potential of the low-potential power supply line VSS is changed from 0 V by an electromagnetic wave of 433 MHz.

FIGS. 9 and 10 illustrate simulation results in a period corresponding to the period P12 illustrated in FIG. 3.

Referring to FIG. 9, a curve L21 represents the voltage waveform of the high-potential power supply line VDD (a waveform obtained when the potential of the high-potential power supply line VDD is changed at 433 MHz in the range of 5 V±4 Vp-p), a curve L22 represents a signal waveform in the input circuit 100 in the related art, and a curve L23 represents a signal waveform in the input circuit 10a according to the first embodiment.

Referring to FIG. 10, a curve L31 represents the voltage waveform of the low-potential power supply line VSS (a waveform obtained when the potential of the low-potential power supply line VSS is changed at 433 MHz in the range of 0 V±4 Vp-p), a curve L32 represents a signal waveform in the input circuit 100 in the related art, and a curve L33 represents a signal waveform in the input circuit 10a according to the first embodiment.

First, as illustrated in FIG. 9, like in the period P12 illustrated in FIG. 3, the signal waveform L22 in the input circuit 100 in the related art is located at a level that is significantly lower than a level at which the voltage waveform L21 of the high-potential power supply line VDD is located.

On the other hand, the signal waveform L23 in the input circuit 10a according to the first embodiment follows the voltage waveform L21 of the high-potential power supply line VDD. That is, an average voltage in the signal waveform L23 is approximately the same as that (for example, 5 V) in the voltage waveform L21.

Next, as illustrated in FIG. 10, the signal waveform L32 in the input circuit 100 in the related art is located at a level that is significantly higher than a level at which the voltage waveform L31 of the low-potential power supply line VSS is located.

On the other hand, the signal waveform L33 in the input circuit 10a according to the first embodiment follows the voltage waveform L31 of the low-potential power supply line VSS. That is, an average voltage in the signal waveform L33 is approximately the same as that (for example, 0 V) in the voltage waveform L31.

Figure 12:
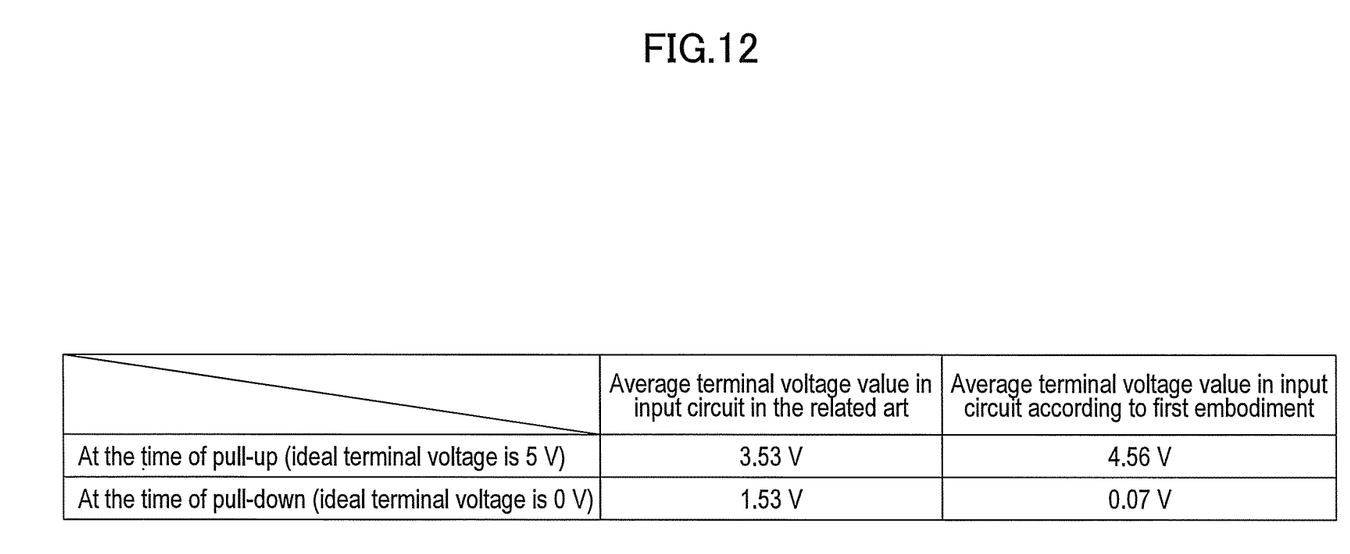
FIG. 12 is a simulation results illustrated in FIGS. 9 and 10.

FIG. 12 describes the simulation results illustrated in FIGS. 9 and 10.

As described in FIG. 12, an average value of terminal voltages (voltages of the input terminal 102) in the input circuit 100 in the relates art illustrated in FIG. 1 is 3.53 V at the time of pull-up which is 1.47 V lower than an ideal voltage of 5 V, and is 1.53 V at the time of pull-down which is 1.53 V higher than an ideal voltage of 0 V.

On the other hand, an average value of terminal voltages (voltages of the input terminal 2) in the input circuit 10a according to the first embodiment illustrated in FIG. 4 is 4.56 V at the time of pull-up which is 0.44 V lower than an ideal voltage of 5 V, and is 0.07 V at the time of pull-down which is 0.07 V higher than an ideal voltage of 0 V.

As is apparent from FIG. 12, if the input circuit 10a according to the first embodiment is used, it can bring both the terminal voltage average values at the time of pull-up and pull-down much closer to ideal voltages, as compared with the input circuit 100 in the related art.

The effect of the first embodiment is also obtained in the second to fifth embodiments.

Thus, according to an embodiment, for example, even if an (unexpected) electromagnetic wave enters an electronic apparatus having an insufficient shielding effect, it is possible to prevent the occurrence of a malfunction caused by the change in an input level. This contributes to high reliability. Furthermore, by improving a tolerance to an electromagnetic wave without using an expensive shield, cost reduction can be achieved.

Figure 11:
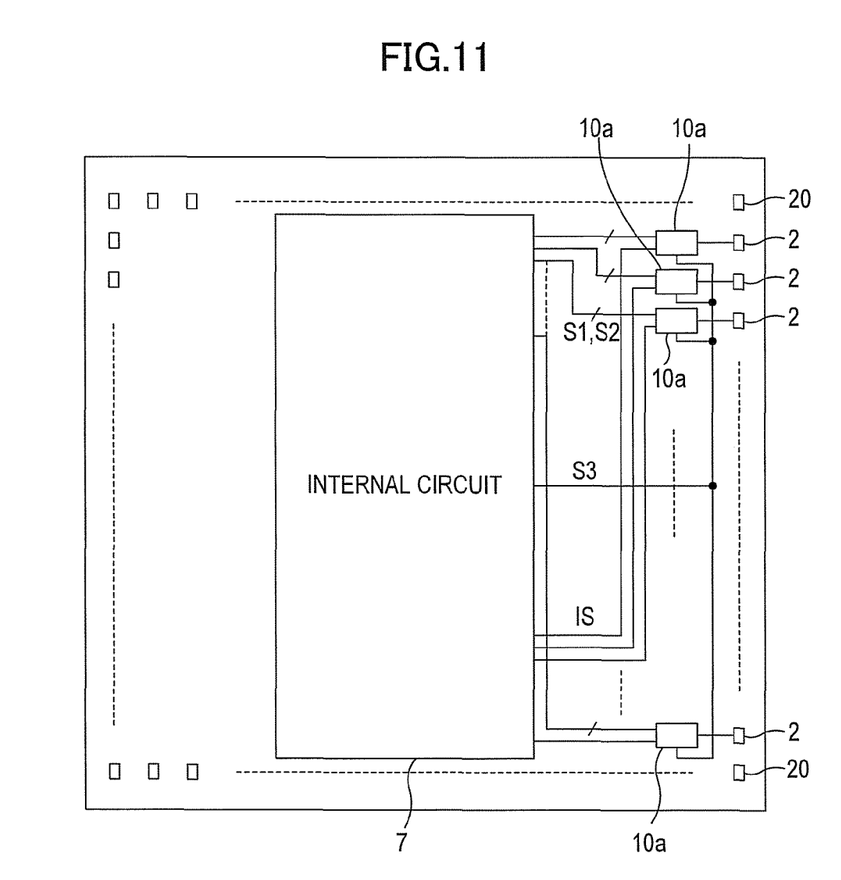
FIG. 11 is a block diagram illustrating an example of a semiconductor integrated circuit according to an embodiment of the present invention.

FIG. 11 is a block diagram illustrating an example of a semiconductor integrated circuit according to an embodiment. As illustrated in FIG. 11, a semiconductor integrated circuit 1 according to an embodiment of the present invention includes a plurality of input terminals 2. Each of the input terminals 2 is connected to an internal circuit 7 via the input circuit 10a.

Although the input circuit 10a according to the first embodiment that has been described with reference to FIG. 4 is used, an input circuit according to any one of the second to fifth embodiments may be used.

The input circuit 10a receives the control signals S1, S2, and S3 from the internal circuit 7 and supplies the signal IS to the internal circuit 7.

As described previously, if the input terminal 2 is used as an original input terminal, the level of the output control signal S1 is set to "H" and the level of the output control signal S2 is set to "L". If the input terminal 2 is used as an output terminal, the level of the input block control signal S3 is set to "L" and the logic of both the output control signals S1 and S2 is set to logic opposite to logic of a signal to be output.

The semiconductor integrated circuit 1 includes terminals 20 used for various applications including the connection to a power supply in addition to the input terminals (output terminals) 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

Although a few preferred embodiments of the present invention have been shown and described, it would be appreciated by those skilled in the art that changes may be made in these embodiments without departing from the principles and spirit of the invention, the scope of which is defined in the claims and their equivalents.

The many features and advantages of the embodiments are apparent from the detailed specification and, thus, it is intended by the appended claims to cover all such features and advantages of the embodiments that fall within the true spirit and scope thereof. The claims may include the phrase "at least one of A, B and C" as an alternative expression that means one or more of A, B and C may be used, contrary to the holding in Superguide v. DIRECTV, 358 F3d 870, 69 USPQ2d 1865. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An input circuit for receiving an input signal supplied to an input terminal, comprising:
   a capacitor having one end connected to the input terminal; and
   a capacitor driving circuit configured to convert the input signal into a signal having positive logic that is the same as a logic of the input signal and to supply the converted signal to the other end of the capacitor so as to drive the capacitor.

2. The input circuit according to claim 1, further comprising:
   a first diode disposed between a first power supply line and the input terminal; and
   a second diode disposed between a second power supply line having a potential lower than that of the first power supply (VDD) line and the input terminal.

3. The input circuit according to claim 2, wherein a direction in which the first diode is connected to the first power supply line (VDD) is opposite to a direction in which the second diode is connected to the second power supply line.

4. The input circuit according to claim 2,
   wherein the first diode is a diode parasitic to a first p-channel MOS transistor, and
   wherein the second diode is a diode parasitic to a first n-channel MOS transistor.

5. The input circuit according to claim 4, wherein the capacitor driving circuit has an even number of inverting circuits configured to convert the input signal into a signal having positive logic that is the same as the logic of the input signal.

6. The input circuit according to claim 5, wherein the capacitor driving circuit includes an input inverter having an input terminal connected to the input terminal of the input circuit and a first inverter having an input terminal connected to an output terminal of the input inverter and an output terminal connected to the other end of the capacitor.

7. The input circuit according to claim 6, further comprising a second inverter that has an input terminal connected to the output terminal of the input inverter and that outputs a signal to an internal circuit as a signal transmitted from the input circuit.

8. The input circuit according to claim 5, wherein the capacitor driving circuit includes a first NAND gate and a first inverter, the first NAND gate having one end connected to the input terminal of the input circuit via a resistor and the other end to which a first input block control signal is supplied, the first inverter having an input terminal connected to an output terminal of the first NAND gate and an output terminal connected to the other end of the capacitor.

9. The input circuit according to claim 8, further comprising:
   a second NAND gate having one end connected to the input terminal of the input circuit via the resistor and the other end to which a second input block control signal is supplied; and
   a second inverter that has an input terminal connected to an output terminal of the second NAND gate and outputs a signal to an internal circuit as a signal transmitted from the input circuit.

10. The input circuit according to claim 9,
    wherein the first NAND gate is formed of a MOS transistor having a first gate width, and
    wherein the second NAND gate is formed of a MOS transistor having a second gate width that is smaller than the first gate width.

11. The input circuit according to claim 4, wherein the capacitor driving circuit is configured to bring the other end of the capacitor into a high-impedance state.

12. The input circuit according to claim 10, wherein the capacitor driving circuit includes:
    a third NAND gate having one end connected to the input terminal of the input circuit via the resistor and the other end to which the second input block control signal is supplied;
    a NOR gate having one end connected to the input terminal of the input circuit via the resistor and the other end to which a signal obtained by inverting the second input block control signal is supplied;
    a second p-channel MOS transistor disposed between the first power supply line and the other end of the capacitor; and
    a second n-channel MOS transistor disposed between the second power supply line and the other end of the capacitor,
    wherein a signal output from the third NAND gate is supplied to a gate of the second p-channel MOS transistor and a signal output from the NOR gate is supplied to a gate of the second n-channel MOS transistor.

13. The input circuit according to claim 8,
    wherein, when the input circuit is used as an original input circuit, a signal having a potential of the first power supply line is supplied to a gate of the first p-channel MOS transistor, a signal having a potential of the second power supply line is supplied to a gate of the first n-channel MOS transistor, and a level of the input block control signal is set to the potential of the first power supply line.

14. The input circuit according to claim 13, wherein the input terminal of the input circuit is connected to at least one of a pull-up resistor or a pull-down resistor.

15. The input circuit according to claim 8, wherein, when the input circuit is used as an output circuit, an output control signal having logic opposite to a logic to be output is supplied to the gates of the first p-channel MOS transistor and the first n-channel MOS transistor and the level of the input block control signal is set to the potential of the second power supply line.

16. A semiconductor integrated circuit, comprising:
    an input circuit configured to receive an input signal supplied to an input terminal of the input circuit,
    wherein the input circuit includes a capacitor having one end connected to the input terminal of the input circuit and a capacitor driving circuit configured to convert the input signal into a signal having positive logic that is the same as a logic of the input signal and to supply the converted signal to the other end of the capacitor so as to drive the capacitor, and
    wherein a signal is transmitted between the input circuit and an internal circuit.

17. The input circuit according to claim 9, wherein the first input block control signal and the second input block control signal are the same.

18. The input circuit according to claim 1, wherein the input circuit is mounted on a substrate in an electronic apparatus.

* * * * *